(12) United States Patent  
Desrosiers et al.

(10) Patent No.: US 8,009,440 B2  
(45) Date of Patent: Aug. 30, 2011

(54) CARTRIDGE FOR SPACE-RESTRICTED INSTALLATION IN RACK-MOUNTED COMPUTER SYSTEM

(75) Inventors: Norman B. Desrosiers, Oxford, NC (US); Dean F. Herring, Youngsville, NC (US); Kevin D. Johnson, Cary, NC (US); Eric A. Stegner, Durham, NC (US); Robert W. Stegner, Raleigh, NC (US); Paul A. Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 1256 days.

(21) Appl. No.: 11/563,798

(22) Filed: Nov. 28, 2006

(65) Prior Publication Data

US 2008/0123274 A1    May 29, 2008

(51) Int. Cl.  
    *H05K 7/14* (2006.01)
(52) U.S. Cl. ......... 361/802; 361/801; 361/737; 361/741
(58) Field of Classification Search .................. 361/801, 361/802  
    See application file for complete search history.

(56) References Cited

U.S. PATENT DOCUMENTS

| | | | |
|---|---|---|---|
| 4,914,552 A | 4/1990 | Keemer | |
| 5,751,559 A | 5/1998 | Jensen et al. | |
| 5,868,585 A | 2/1999 | Barthel et al. | |
| 6,071,143 A | 6/2000 | Barthel et al. | |
| 6,115,258 A | 9/2000 | Hoyle, Jr. et al. | |
| 6,128,196 A | 10/2000 | Hoyle, Jr. et al. | |
| 6,162,073 A | 12/2000 | Haq et al. | |
| 6,195,259 B1 * | 2/2001 | Whitman et al. | 361/725 |
| 6,288,911 B1 | 9/2001 | Aoki et al. | |
| 6,411,517 B1 * | 6/2002 | Babin | 361/759 |
| 6,529,383 B1 | 3/2003 | Barringer et al. | |
| 6,597,581 B2 | 7/2003 | Barringer et al. | |
| 6,709,276 B2 | 3/2004 | Barringer et al. | |
| 6,816,383 B2 | 11/2004 | Barringer et al. | |

* cited by examiner

*Primary Examiner* — Tuan T Dinh  
*Assistant Examiner* — Abiy Getachew  
(74) *Attorney, Agent, or Firm* — Steven M. Greenberg, Esq.; Carey, Rodriguez, Greenberg & Paul (57) ABSTRACT

A computer device includes a chassis, a card connector, and a cartridge. The card connector is attached to the chassis and is adapted to receive a card. The cartridge includes a guide plate, a card holder, and an actuator. The guide plate is removably engaged to the chassis. The card holder is connectable to the card and movable, relative to the guide plate, between an engaged position and a disengaged position. In the engaged position, the card is connected the card connector, and in the disengaged position, the card is disconnected from the card connector. The actuator is engaged with the guide plate, and the actuator linearly moves between a first position and a second position relative to the guide plate. The movement of the actuator from the first position to the second position causes the movement of the card holder from the disengaged position to the engaged position. The computer device is a server, and the cartridge is introduced into front face or a rear face of the server.

18 Claims, 9 Drawing Sheets

CARTRIDGE FOR SPACE-RESTRICTED INSTALLATION IN RACK-MOUNTED COMPUTER SYSTEM

BACKGROUND OF THE INVENTION

1. Field of the Invention

The disclosure relates generally to peripheral devices for computer systems and, more specifically, to a card cartridge for insertion into a space-restricted location within a computer system.

2. Description of the Related Art

For equipment, such as computer servers and audio/video devices, mounted in a rack, there is an occasional need to adjust and/or modify the equipment without completely removing the equipment from the rack. For example, the complete removal of the equipment from the rack may require the disconnection of one or all of a multitude of cables/connectors to which the equipment is attached.

In certain instances, it is desired to subsequently add a peripheral device, such as a PCI card, to the equipment, which typically involves opening a top cover of the equipment and inserting the card into a planar slot. There are, however, several issues associated with the ability to perform this action without completely removing the equipment from the rack.

In some instances, the cables/connectors may not have enough slack to permit complete or even partial removal of the equipment from the rack. Even partially removing the cables/connectors may cause harm to the cables/connectors, which may be damaged by excessive movement associated with the complete or partial removal of the equipment. Also, to allow the cables/connectors to be moved, a cable connector arm is typically required to support the weight of the cables so as to prevent the cables/connectors from being damaged and/or prevent the cables/connectors from disconnecting themselves from the equipment due to sagging or snagging.

Moreover, slides are often used to mount the equipment on the rack to allow for ease of partially removing the equipment from the rack. Slides not only represent an additional expense to the overall cost of the system, the use of slides also take up space within the rack. Since the size of the rack is usually predefined, space required for use of the slides is not otherwise available for the equipment, which can negatively affect the performance of the equipment. There is, therefore, a need for a computer system and device that allows peripheral devices, such as a card, to be inserted into the computer system without requiring full or partial removal of the computer system from a rack.

BRIEF SUMMARY OF THE INVENTION

Embodiments of the invention address deficiencies of the art in respect to computer systems and provide a novel and non-obvious apparatus for space-restricted installation of a peripheral device, such as a card, into a rack-mounted computer system. In this regard, a computer device includes a chassis, a card connector, and a cartridge. The card connector is attached to the chassis and is adapted to receive a card. The cartridge includes a guide plate, a card holder, and an actuator. The guide plate is removably engaged to the chassis. The card holder is connectable to the card and movable, relative to the guide plate, between an engaged position and a disengaged position. In the engaged position, the card is connected the card connector, and in the disengaged position, the card is disconnected from the card connector. The actuator is engaged with the guide plate, and the actuator linearly moves between a first position and a second position relative to the guide plate. The movement of the actuator from the first position to the second position causes the card holder to move from the disengaged position to the engaged position. The computer device is a server, and the cartridge is introduced into front face or a rear face of the server.

In certain aspects, the chassis includes at least one guide for engaging the guide plate and maintaining a position of the guide plate relative to the chassis. Movement of the guide plate relative to the guide, upon the guide plate engaging the guide, is substantially parallel to movement of the actuator between the first position and the second position, and planar movement of the guide plate relative to the guide, upon the guide plate engaging the guide, is substantially parallel to planar movement of the card holder between the engaged position and the disengaged position. Also, the card holder moves linearly between the disengaged position and the engaged position, and the card holder moves between the disengaged position and the engaged position substantially perpendicular to movement of the actuator between the first position and the second position. The actuator moves relative to the guide plate only along a single axis.

In further aspects, the guide plate includes a first parallel pair of linear slots and a second parallel pair of linear slots, and the first parallel pair of linear slots are substantially perpendicular to the second parallel pair of linear slots. Also, the actuator, in the first position, extends beyond an end of the cartridge.

In yet other aspects, the actuator includes a pair of actuator slots, and each of the actuator slots have a first end and a second end. The first end is further along than the second end in a first direction defined by movement of the actuator from the second position to the first position, and the first end is further along than the second end in a second direction defined by movement of the card holder from the disengaged position to the engaged position.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Figure 1:
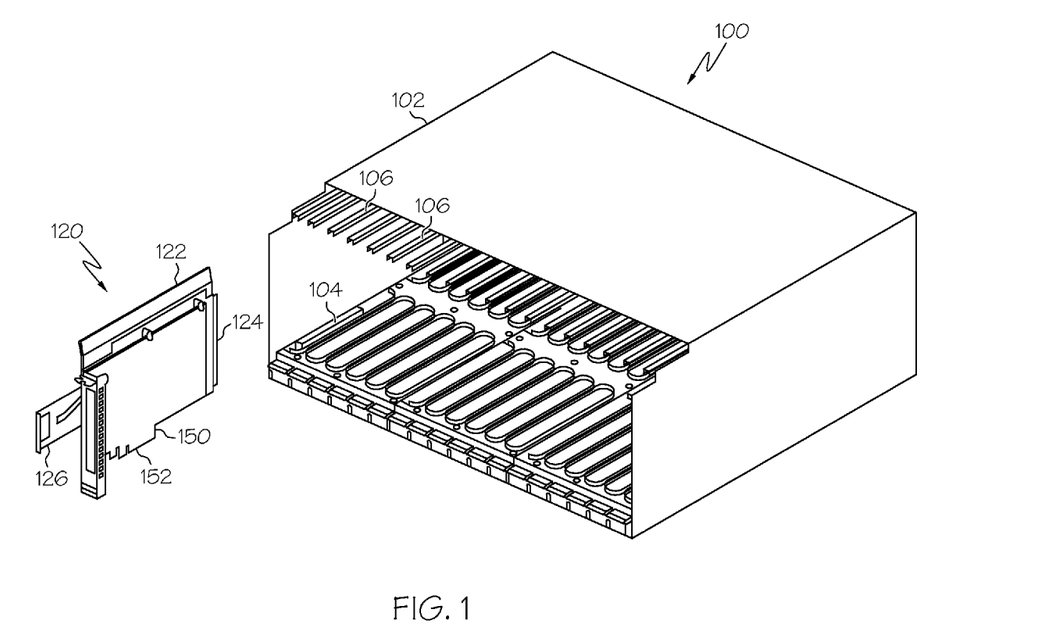
FIG. 1 is a perspective view of a server and cartridge in accordance with the inventive arrangements.
Figure 3:
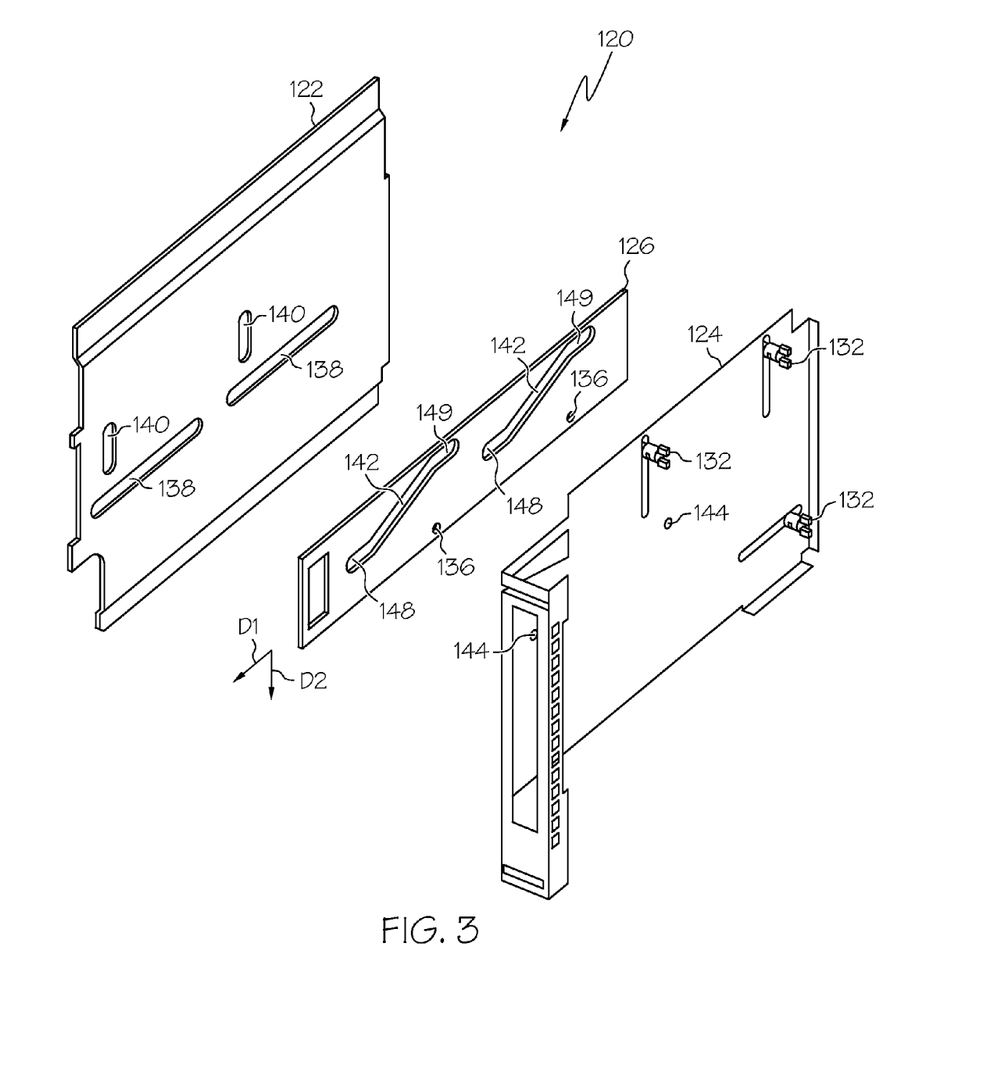
FIG. 3 is an exploded perspective view of a guide plate, actuator, and card holder for the cartridge in accordance with the inventive arrangements.

Referring generally to FIGS. 1 and 3, a computer device 100 includes a chassis 102, a card connector 104, and a cartridge 120. The card connector 104 may be attached to the chassis 102 and is adapted to receive a peripheral device, such as a card 140. The cartridge 120 includes a guide plate 122, a card holder 124, and an actuator 126. Although a rack is not illustrated, the computer device 100 may be a server positioned within the rack.

The guide plate 122 is removably engaged to the chassis 102. The card holder 124 is connectable to the card 150 and movable, relative to the guide plate 122, between an engaged position and a disengaged position. In the engaged position, a connector 152 of the card 150 is connected the card connector 104, and in the disengaged position, the card 150 is disconnected from the card connector 104. The actuator 126 engages the guide plate 122, and the actuator 126 linearly moves between a first position and a second position relative to the guide plate 122. The movement of the actuator 126 from the first position to the second position causes the card holder 124 to move from the disengaged position to the engaged position.

As illustrated in FIG. 1, the chassis 102 may include at least one guide 106 for engaging the guide plate 122 of the cartridge 120 and for maintaining a position of the guide plate 122, and thus the cartridge 120, relative to the chassis 102. In certain aspects of the computer device 100, the cartridge 120 is introduced into a front face or rear face of the chassis 102. In so doing, the computer device 100 may remain within a rack (not shown) and not be either partially removed or completely removed to introduce the peripheral device into the computer device 100.

The guide plate 122 is moved relative to the guide 106 along a line that intersects the front and/or rear face of the chassis 102. This movement of the guide plate 122 relative to the guide 106 to engage the guide 106, as will be subsequently described in greater detail, is substantially parallel to movement of the actuator 126 between the first position and the second position. Also, planar movement of the guide plate 122 relative to the guide 106, upon the guide plate 122 engaging the guide 106, is substantially parallel to planar movement of the card holder 124 between the engaged position and the disengaged position.

Figure 2A:
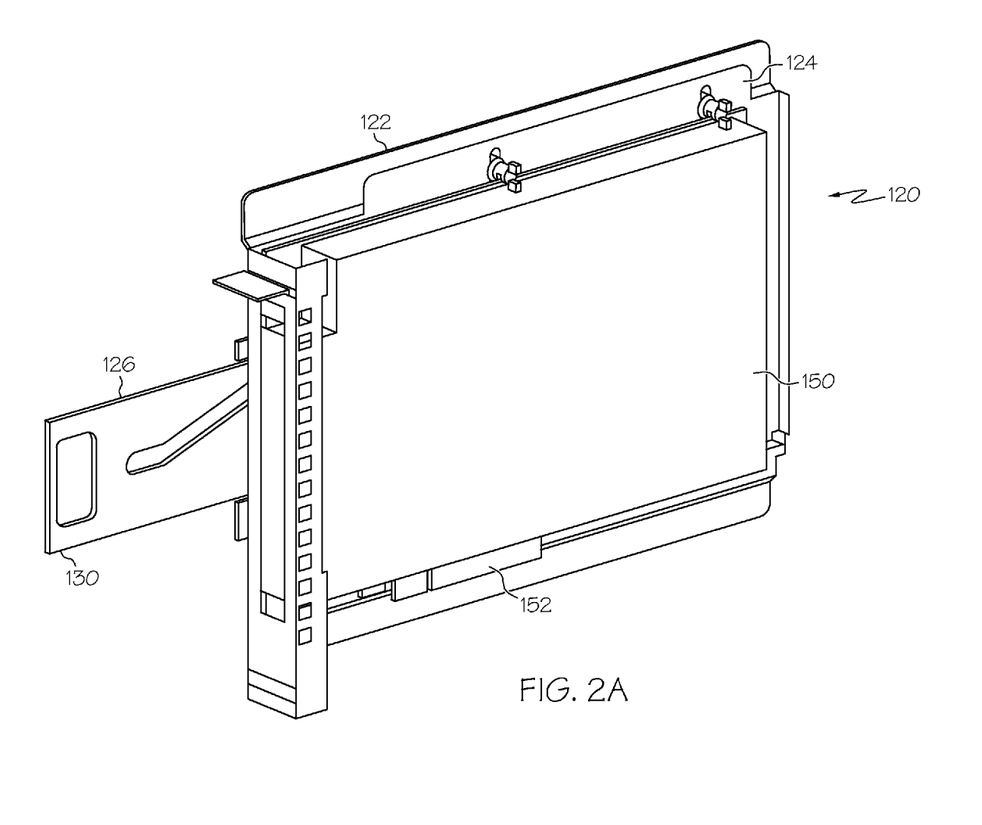
FIGS. 2A and 2B are perspective views of the cartridge with a card holder of the cartridge respectively in a disengaged position and an engaged position.
Figure 2B:
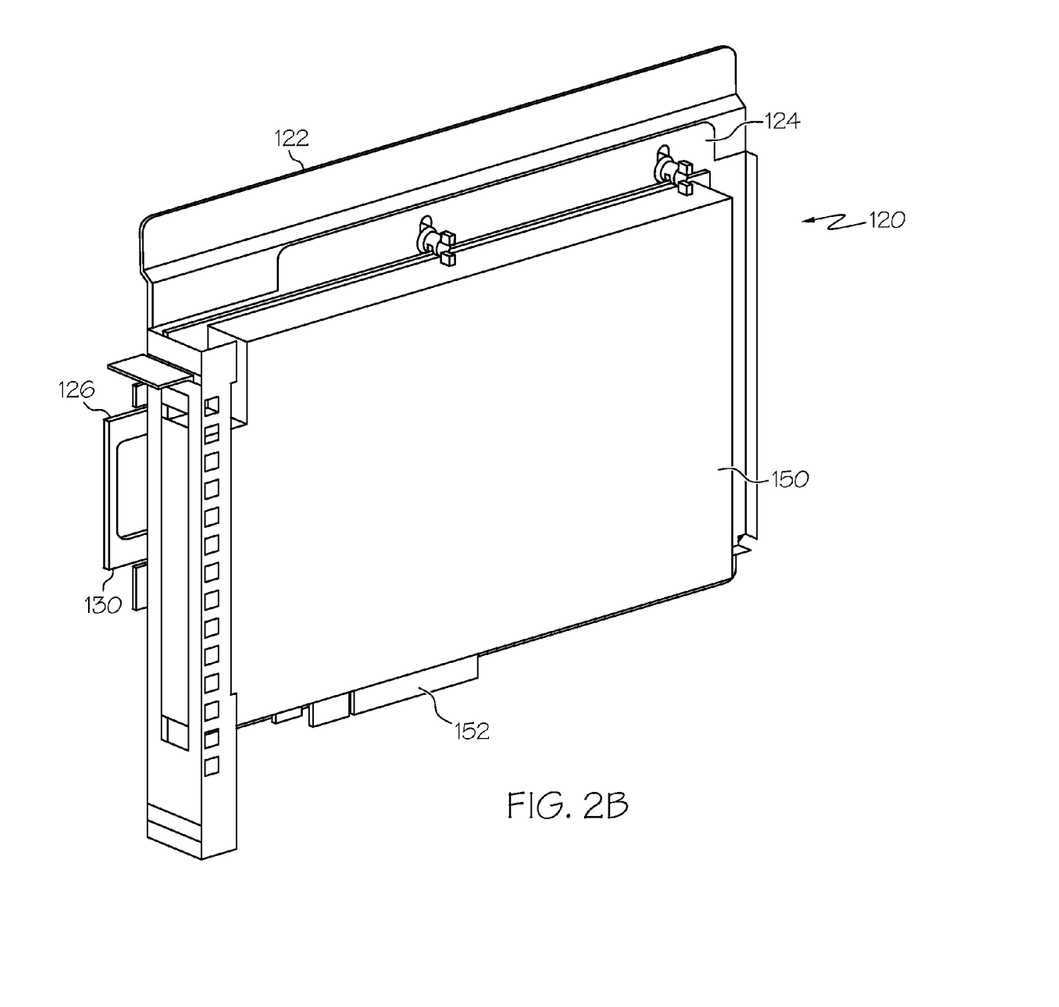

Referring to FIGS. 2A and 2B, movement of the card 150 within the cartridge 120 is illustrated. Upon the actuator 126 being in a first position (i.e., FIG. 2A), the card 150 is disengaged from a card connector 104 (see FIG. 1) of the chassis 102. As the actuator 126 is moved into a second position (i.e., FIG. 2B), the card holder 124 moves relative to the guide plate 122, and the card 150, which is connected to the card holder 124 moves into an engaged position with the card connector 104.

Although not limited in this manner, upon the card 150 being engaged with card connector 104, the handle 130 of the actuator 126 is positioned relative to the cartridge 120 such that the handle 130 may extend only slightly beyond an end of the cartridge 120. In this manner, the profile of the cartridge 120 within the computer device 100 can be reduced. Also, upon the card 150 being disengaged with card connector 104, the handle 130 of the actuator 126 is positioned relative to the cartridge 120 such that the handle 130 extends substantially beyond the end of the cartridge 120 to permit a user to more easily grasp the handle 130.

Figure 4A:
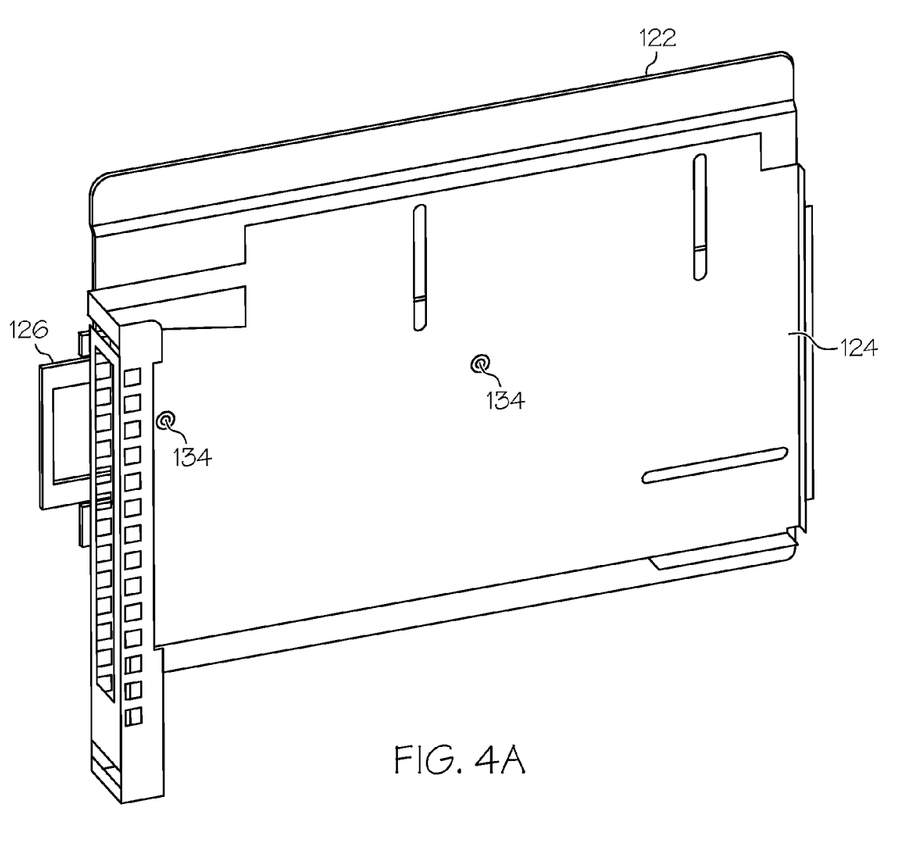
FIGS. 4A and 4B are perspective views respectively of the assembled card cartridge and the assembled cartridge including a card and cover.
Figure 4B:
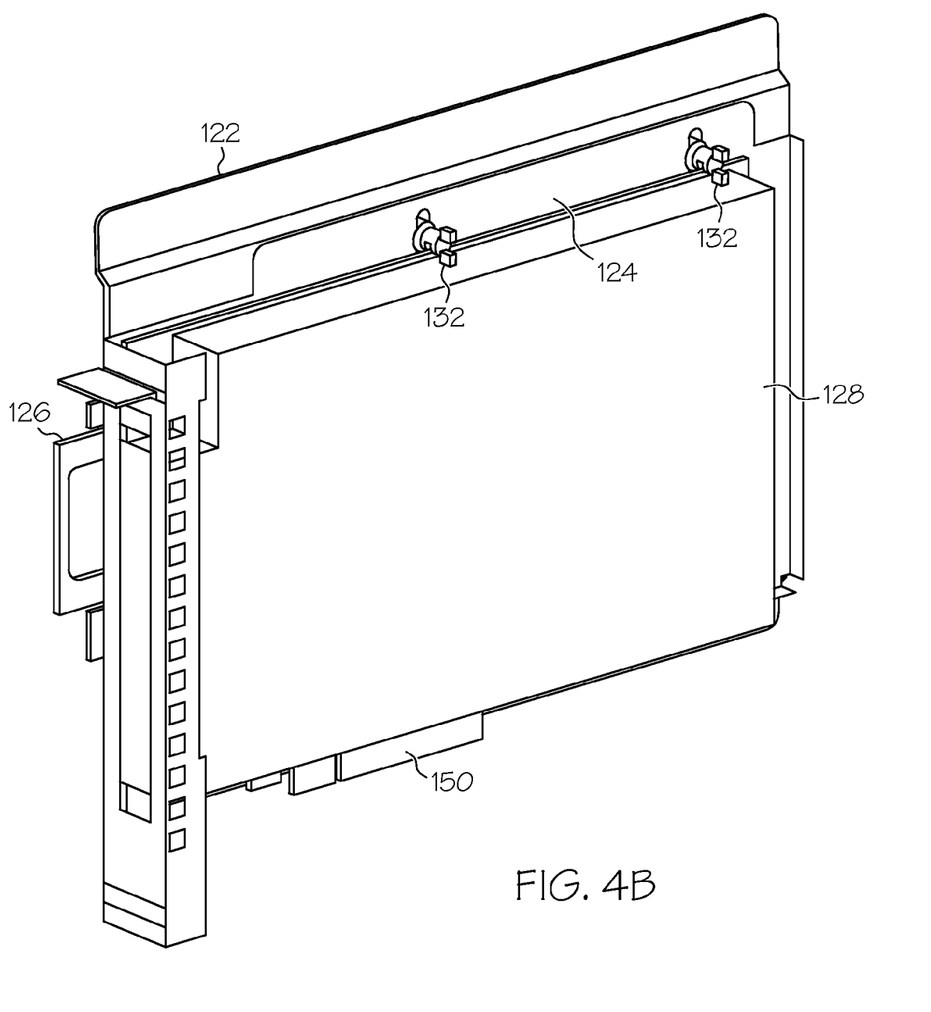

FIGS. 3, 4A, and 4B illustrate further details of the cartridge 120. The guide plate 122 includes a first parallel pair of linear slots 138 and a second parallel pair of linear slots 140. The first pair of slots 138 defines the motion of the actuator 126 relative to the guide plate 122. The movement of the actuator 126 relative to the guide plate 122 is defined via actuator slides 146 (see FIGS. 5A-5C) that extend from the actuator 126, via for example holes 136 in the actuator 126, and into the first pair of slots 138. Although shown with slots 138 positioned in the guide plate 122 and actuator slides 146 extending from the actuator 126, the slots 138 may be positioned in the actuator 126, and the actuator slides 146 may extend from the guide plate 122 into the slots 138.

Although not limited in this manner, in certain aspects of the cartridge 120, the movement of the actuator 126 is defined along a straight line, such that the actuator 126 linearly moves between the first position and the second position. Also, the actuator 126 may move relative to the guide plate 122 only along a single axis. Additionally, as previously described, the movement of the actuator 126 between the first position and the second position may be substantially parallel to the movement of guide plate 122 relative to the guide 106 (see FIG. 1), upon the guide plate 122 engaging the guide 106.

The second pair of slots 140 defines the motion of the card holder 124 relative to the guide plate 122. The movement of the card holder 124 relative to the guide plate 122 is defined via card holder slides 134 (see FIGS. 5A-5C) that extend from the card holder 124 via, for example, holes 144 in the card holder 124, and into the second pair of slots 140. Although shown with slots 140 positioned in the guide plate 122 and card holder slides 134 extending from the card holder 124, the slots 140 may be positioned in the card holder 124, and the card holder slides 134 may extend from the guide plate 122 into the slots 140.

Although not limited in this manner, in certain aspects of the cartridge 120, the movement of the card holder 124 is defined along a straight line, such that the card holder 124 linearly moves between the engaged position and the disengaged position. Also, the card holder 124 may move relative to the guide plate 122 only along a single axis. Additionally, as previously described, the planar movement of the card holder 124 between the engaged position and the disengaged position may be substantially parallel to the planar movement of guide plate 122 relative to the guide 106 (see FIG. 1), upon the guide plate 122 engaging the guide 106.

The cartridge 120 is not limited in this manner, however, in certain aspects of the cartridge 120, the first parallel pair of linear slots 138 may be substantially perpendicular to the second parallel pair of linear slots 140. Since the first and second pairs of slots 138, 140 respectively define the movement of the actuator 126 and the card holder 124 relative to the guide plate 122, positioning the first and second pairs of slots 138, 140 perpendicular to one another results in the movement of the card holder 124 between the disengaged position to the engaged position being substantially perpendicular to the movement of the actuator 126 between the first position and the second position The actuator 126 includes a pair of actuator slots 142. The card holder slides 134 that extend from the card holder 124 and into the second pair of slots 140 in the guide plate 122 also extend through the actuator slots 142. The actuator slots 142 have a first end 148 and a second end 149, and the actuator slots 142 may be configured such that the first end 148 is further along than the second end 148 in a first direction D1 defined by movement of the actuator 126 from the second position (i.e., FIG. 2B) to the first position (i.e., FIG. 2A). The first end 148 may also be further along than the second end 149 in a second direction D2 defined by movement of the card holder 124 from the disengaged position (FIG. 2A) to the engaged position (FIG. 2B).

The first and second ends 148, 149 may also include horizontal portions or dwells. Upon the card holder slides 134 being positioned within the horizontal portions, for example, upon the actuator being in the first position or the second position, this positioning prevents the card 150 from being unseated during, for example, a vertical shock load.

Although described as separate from the card holder 124, the card 150 may be integral with the card holder 124. Alternatively, as described, the card 150 may be connected to the card holder 124 with, for example, fasteners 132. The positioning of fasteners 132 relative to the card holder 124 may be adjustable to allow for different types and sizes of cards 150 to be attached to the card holder 124. Although not limited in the manner in which the position of the fasteners 132 are adjustable, in certain aspects of the cartridge 120, the fasteners 132 may be positioned within slots in the card holder 124.

The card holder 124 may also include an attachable cover 128 that is positioned over the card 150. In so doing, the card 150 may be protected from damage and the cover 128 may also be used to reduce exposure of the card 150 to foreign matter, such as dust.

Figure 5A:
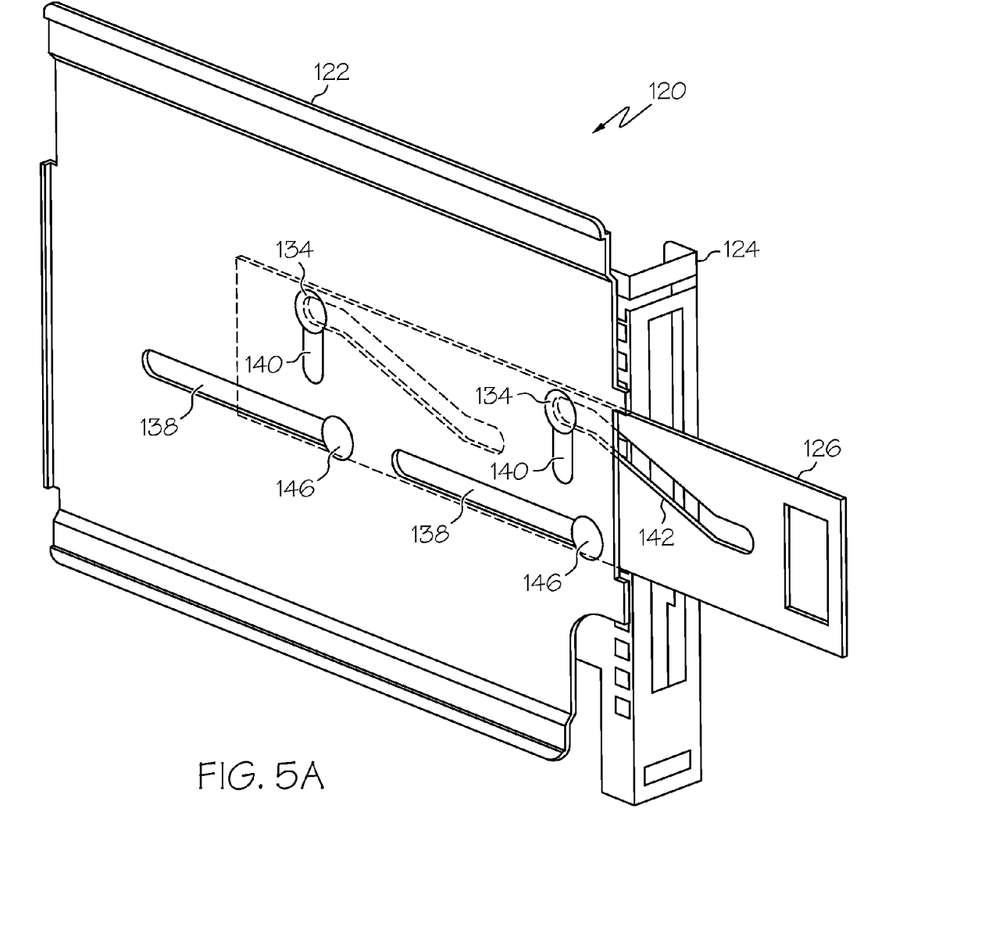
FIGS. 5A, 5B, and 5C are perspective views of the cartridge as the actuator moves from a first position in FIG. 5A to a second position in FIG. 5C.
Figure 5B:
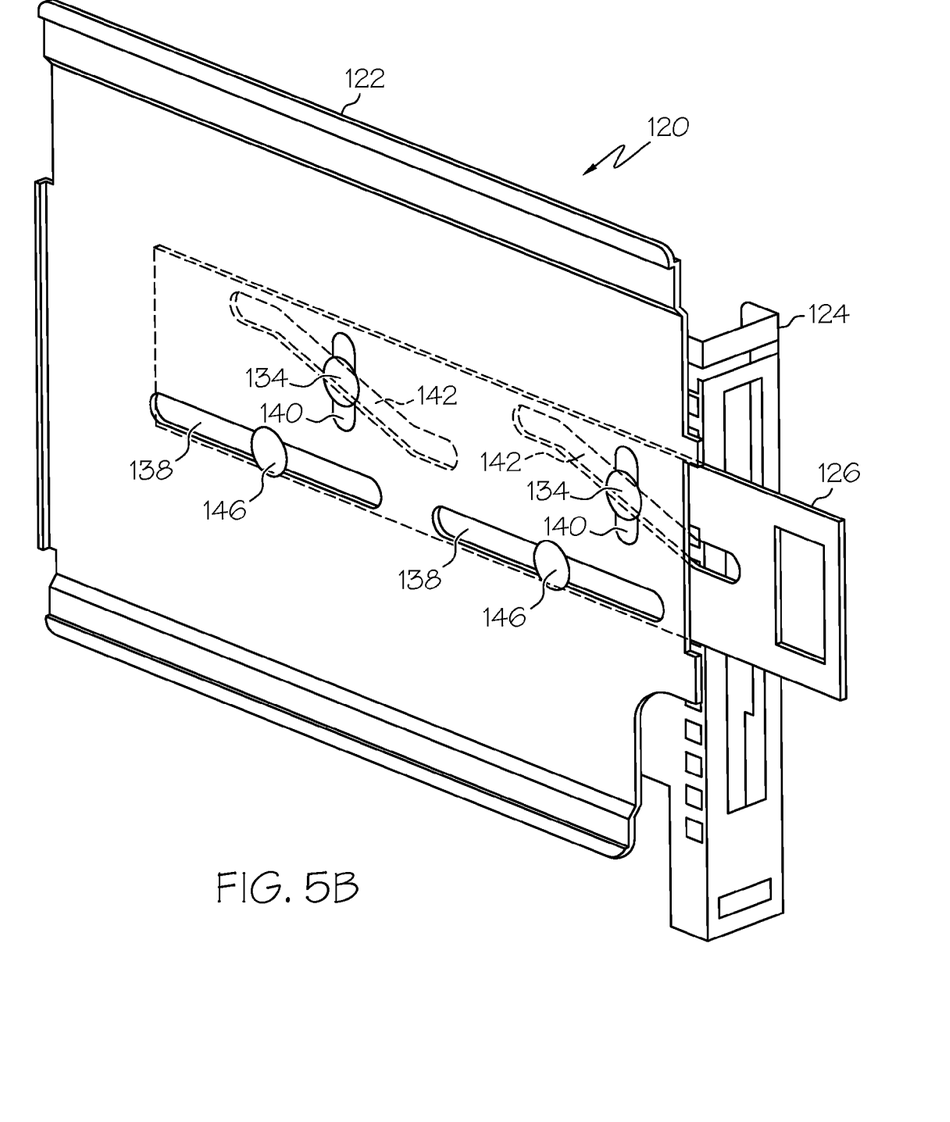
Figure 5C:
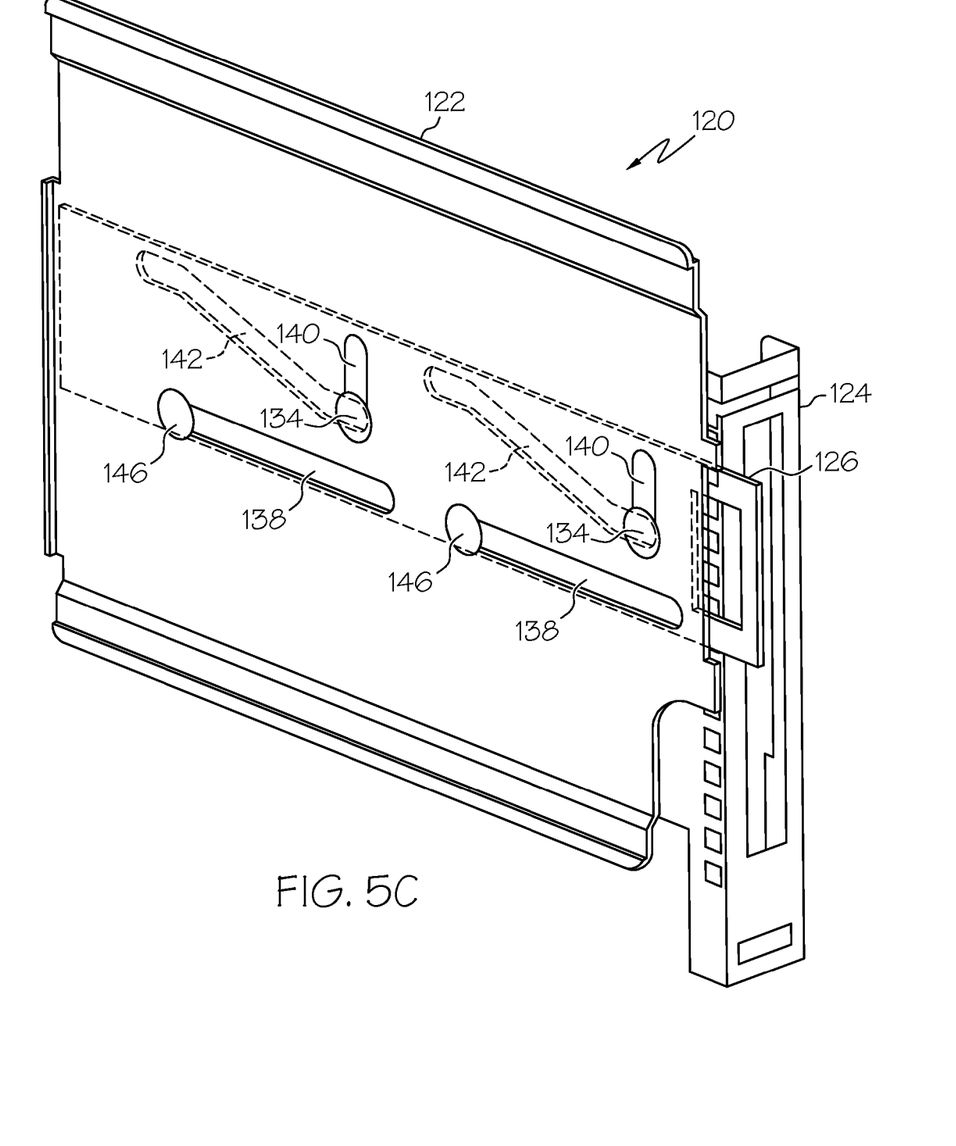

Referring to FIGS. 5A, 5B, and 5C, use of the actuator 126 to move the card holder 124, and thus the card 150, relative to the guide plate 122 is illustrated. As the actuator 126 is pushed forward into the guide plate 122, the card holder slides 134 interact with the edges of the actuator slots 142 and are pushed downward. Since the card holder 124, and thus the card 150, is connected to the card holder slides 134, downward movement of the card holder slides 134 results in downward movement of the card holder 124. The actuator slides 146 interact with the edges of the first pair of slots 138 in the guide plate 122, which prevent the actuator slides 146 from moving upward or downward relative to the guide plate 122. The opposite motion occurs as the actuator 126 is pulled out of the cartridge 120 (i.e., the motion from FIG. 5C to FIG. 5A).

What is claimed is:

1. A cartridge for inserting a card into a card connector within a computer device, comprising:
   a guide plate adapted to be received by the computer device;
   a card holder connectable to the card and movable, relative to the guide plate, between an engaged position and a disengaged position; and
   an actuator engaged with the guide plate, wherein
   the actuator linearly movable between a first position and a second position relative to the guide plate, and
   movement of the actuator from the first position to the second position causing the movement of the card holder from the disengaged position to the engaged position, wherein
   the card holder moves between the disengaged position and the engaged position substantially perpendicular to movement of the actuator between the first position and the second position.

2. The cartridge of claim 1, wherein the card holder moves linearly between the disengaged position and the engaged position.

3. The cartridge of claim 1, wherein
   the guide plate includes a first parallel pair of linear slots and a second parallel pair of linear slots, and
   the first parallel pair of linear slots being substantially perpendicular to the second parallel pair of linear slots.

4. The cartridge of claim 1, wherein the actuator, in the first position, extends beyond an end of the cartridge.

5. The cartridge of claim 1, wherein
   the actuator includes a pair of actuator slots, and each of the actuator slots having a first end and a second end,
   the first end is further along than the second end in a first direction defined by movement of the actuator from the second position to the first position, and
   the first end is further along than the second end in a second direction defined by movement of the card holder from the disengaged position to the engaged position.

6. The cartridge of claim 1, wherein the actuator moves relative to the guide plate only along a single axis.

7. The cartridge device of claim 1, wherein the computer device is a server.

8. A computer device, comprising
   a chassis,
   a card connector attached to the chassis and adapted to receive a card; and
   a cartridge including
      a guide plate removably engaged to the chassis,
      a card holder connectable to the card and movable, relative to the guide plate, between an engaged position and a disengaged position, and
      an actuator engaged with the guide plate, wherein
   the actuator linearly movable between a first position and a second position relative to the guide plate,
   movement of the actuator from the first position to the second position causing the movement of the card holder from the disengaged position to the engaged position,
   in the engaged position, the card is connected the card connector,
   in the disengaged position, the card is disconnected from the card connector, and
   the card holder moves between the disengaged position and the engaged position substantially perpendicular to movement of the actuator between the first position and the second position.

9. The computer device of claim 8, wherein the chassis includes at least one guide for engaging the guide plate and maintaining a position of the guide plate relative to the chassis.

10. The computer device of claim 8, wherein movement of the guide plate relative to the guide, upon the guide plate engaging the guide, is substantially parallel to movement of the actuator between the first position and the second position.

11. The computer device of claim 8, wherein planar movement of the guide plate relative to the guide, upon the guide plate engaging the guide, is substantially parallel to planar movement of the card holder between the engaged position and the disengaged position.

12. The computer device of claim 8, wherein the card holder moves linearly between the disengaged position and the engaged position.

13. The computer device of claim 8, wherein
   the guide plate includes a first parallel pair of linear slots and a second parallel pair of linear slots, and
   the first parallel pair of linear slots being substantially perpendicular to the second parallel pair of linear slots.

14. The computer device of claim 8, wherein the actuator, in the first position, extends beyond an end of the cartridge.

15. The computer device of claim 8, wherein
   the actuator includes a pair of actuator slots, and each of the actuator slots having a first end and a second end,
   the first end is further along than the second end in a first direction defined by movement of the actuator from the second position to the first position, and
   the first end is further along than the second end in a second direction defined by movement of the card holder from the disengaged position to the engaged position.

16. The computer device of claim 8, wherein the computer device is a server.

17. The computer device of claim 8, wherein the actuator moves relative to the guide plate only along a single axis.

18. The computer device of claim 17, wherein the cartridge is introduced into front face or a rear face of the server.

* * * * *